(12) United States Patent
Rogge et al.

(10) Patent No.: US 9,691,033 B2
(45) Date of Patent: Jun. 27, 2017

(54) QUANTUM COMPUTING WITH ACCEPTOR-BASED QUBITS

(71) Applicant: NEWSOUTH INNOVATIONS PRY LIMITED, Sydney (AU)

(72) Inventors: Sven Rogge, Sydney (AU); Joseph Salfi, Sydney (AU); Jan Andries Mol, Sydney (AU)

(73) Assignee: Newsouth Innovations Pty Limited, Sydney (AU)

( * ) Notice: Subject to any disclaimer, the term of this patent is extended or adjusted under 35 U.S.C. 154(b) by 0 days.

(21) Appl. No.: 14/778,361

(22) PCT Filed: Jan. 3, 2014

(86) PCT No.: PCT/AU2014/000003
§ 371 (c)(1),
(2) Date: Sep. 18, 2015

(87) PCT Pub. No.: WO2014/146162
PCT Pub. Date: Sep. 25, 2014

(65) Prior Publication Data
US 2016/0275410 A1  Sep. 22, 2016

(30) Foreign Application Priority Data
Mar. 20, 2013  (AU) ................ 2013900975

(51) Int. Cl.
*G06N 99/00* (2010.01)
*H03K 19/195* (2006.01)
*B82Y 10/00* (2011.01)

(52) U.S. Cl.
CPC ............ *G06N 99/002* (2013.01); *B82Y 10/00* (2013.01); *H03K 19/195* (2013.01)

(58) Field of Classification Search
CPC ......................... G06N 99/002; H03K 19/195
See application file for complete search history.

(56) References Cited

U.S. PATENT DOCUMENTS

| 6,472,681 | B1 * | 10/2002 | Kane | .................. B82Y 10/00 |
|---|---|---|---|---|
| | | | | 257/14 |
| 7,737,432 | B2 * | 6/2010 | Hawrylak | ............ G06N 99/002 |
| | | | | 257/14 |
| 2002/0190249 | A1 * | 12/2002 | Williams | ............. G06N 99/002 |
| | | | | 257/14 |
| 2003/0040168 | A1 * | 2/2003 | Cain | ................. B82Y 10/00 |
| | | | | 438/505 |

(Continued)

OTHER PUBLICATIONS

Nowack et al. "Coherent Control of a Single Electron Spin with Electric Fields" Science, vol. 318, pp. 1430-1433 (2007).

(Continued)

*Primary Examiner* — Douglas W Owens
*Assistant Examiner* — James H Cho
(74) *Attorney, Agent, or Firm* — Wood, Phillips, Katz, Clark & Mortimer

(57) ABSTRACT

A quantum computer comprises of at least one qubit formed from holes created with acceptor atoms (10) in crystalline silicon (12) and a pair of gates (14, 16) located above the acceptor atoms (10) to apply direct electric field and alternating electric field for switching, manipulating the qubit such that quantum information resulting from being manipulated is stored from decoherence.

10 Claims, 7 Drawing Sheets

(56) References Cited

U.S. PATENT DOCUMENTS

2011/0121895 A1* 5/2011 Morello ............... B82Y 10/00
                                                  327/581

OTHER PUBLICATIONS

Nadj-Perge et al. "Spin-orbit quisit in a semiconductor nanowire" Letters to Nature, vol. 468, pp. 10874-1087 (2010).
Song et al. "Manipulation and decoherence of acceptor states in silicon" Department of Physics & Astronomy, Michigan State University, pp. 1-6 (2010).
Kloeffel et al. "Strong spin-orbit interaction and helical hole states in Ge/Si nanowires" Department of Physics, University of Basel, pp. 1-8 (2011).
Goswami et al. "Controllable valley splitting in silicon quantum devices" Nature Physics, vol. 3, pp. 41-45 (2007).
Brunner et al. A Coherent Single-Hole Spin in a Semiconductor Science, vol. 325, pp. 70-72(2009).
Hu et al. "Hole spin relaxation in Ge—Si core—shell nanowire qubits" Nature Nanotechnology, vol. 7, pp. 47-50 (2012).
Morton et al. "Embracing the quantum limit in silicon computing" Nature, vol. 479, pp. 345-353 (2011).
Tang et al. "All-Electrical Control of Single Ion Spins in a Semiconductor" Physical Review Letters, The American Physical Society, pp. 1-4 (2006).
Kane "A silicon-based nuclear spin quantum computer" Nature, vol. 393, pp. 133-137.
Morello et al. "Single-shot readout or an electron spin in silicon" Centre for Quantum Computer Technology, School of Electrical Engineering & Telecommunications, Australia, pp. 1-5 (2010).
Fuechsle et al. "A single-atom transistor" Nature Nanotechnology, vol. 7, pp. 242-246 (2012).
Tyryshkin et al. "Electron spin coherence exceeding seconds in high-purity silicon" Department of Electrical Engineering, Princeton University, New Jersey, pp. 1-18.
Averin et al. "Theory of single-electron charging of quantum wells and dots" Physical Review B, The American Physical Society vol. 44 No. 12, pp. 6199-6211 (1991).
Beenakker "Theory of Coulomb-blockade oscillations in the conductance of a quantum dot" Physical Review B, The American Physical Society vol. 44 No, 4, pp. 1646-1656 (1991).
Yakunin et al. "Spatial Structure of an Individual Mn Acceptor in GaAs" COBRA Inter-University, Eindhoven University of Technology, Netherlands, pp. 1-4 (2004).
Yakunin et al. "Warping a single Mn acceptor wavefunction by straining the GaAs host" Nature, vol. 6, pp. 512-515 (2007).
Loth et al. "On the connection of anisotropic conductivity to tip-induced space-charge layers in scanning tunneling spectroscopy of p-doped GaAs" Physikalisches Institut der Universitat Gottingen, Germany, pp. 1-11 (2007).
Wjnheijmer et al. "Influence of the tip work function on scanning tunneling microscopy and spectroscopy on zinc doped GaAs" J. Vac. Science & Technology B, vol. 28, pp. 1086-1092(2010).
Bir et al. "Spin and combined resonance on acceptor centres in Ge and Si type crystals—II: The effect of the electrical field and relaxation time" J. Phys. Chem. Solids, vol. 24, pp. 1475-1486 (1963).
Kopf et al. "Linear Stark and nonlinear Zeeman coupling to the ground state of effective mass acceptors in silicon" Physical Review Letters, The American Physical Society, vol. 69, No, 10, pp. 1580-1583 (1992).
Schechter. "Theory of shallow acceptor states in Si and Ge" J. Phys. Chemistry Solids, vol. 23, pp. 237-247 (1962).
Lipari et al. "Angular Momentum Theory and Localized States in Solids. Investigation of Shallow Acceptor States in Semiconductors" Physical Review Letters, The American Physical Society, vol. 25, No. 24, pp. 1660-1664 (1970).
Teichmann et al. "Controlled Charge Switching on a Single Donor with a Scanning Tunneling Microscope" Physical Review Letters, The American Physical Society, pp. 1-4 (2008).
Feenstra. "Tunneling spectroscopy of the (110) surface of direct-gap III-V Semiconductors" Physical Review B, vol. 50, No. 7, pp. 4561-4570 (1994).

* cited by examiner

Table 1: Key requirements of the acceptor qubit

| | | $f_{Rabi}$ | | |
|---|---|---|---|---|
| Spin rotations | $1/T_1^*, 1/T_2^*$ | | | |
| | 0.1, 0.4 MHz [a] | ~1 GHz [b] | | |
| Adiabatic transfer | $1/T_1^*, 1/T_2^*$ | $\Delta/h \leq E_Z/h$ [b] | $\ll$ | $\delta E/h$ |
| | 0.1, 0.4 MHz [a] | ~40 GHz [c] | | ~1 THz |
| Temperature | $k_B T/h$ | $E_Z/h$ | $\ll$ | $\delta E/h$ |
| | ~10 GHz | ~40 GHz [c] | | ~1 THz |

[a] Experimental values from Ref. (3)
[b] For $V_{a.c.} \sim 0.1$ V, see Supplementary Information
[c] For $B \sim 1.5$ T, see Supplementary Information

Fig. 6

QUANTUM COMPUTING WITH ACCEPTOR-BASED QUBITS

TECHNICAL FIELD

This disclosure concerns quantum computers and in particular quantum computers that use a new form of quantum bit [qubit] for use in electronic quantum computing. These qubits are based on the use of acceptor dopants that can bind a hole.

SUMMARY OF THE INVENTION

A quantum computer, comprising:

One or more electrically active acceptor atoms incorporated into crystalline silicon, wherein each acceptor atom creates a single hole bound to the acceptor within the crystalline silicon to form an acceptor qubit.

Wherein each acceptor qubit is either in an 'ON' state where the qubit is able to be manipulated by applying an alternating electric field; or in an 'OFF' state where the qubit is protected from decoherence.

A first pair of gates located above each acceptor atom, by which an alternating electric field is applied to the silicon to manipulate the qubit hole spin at resonance, and by which a direct electric field is applied to the silicon to manipulate the strength of the interaction between the qubit and the alternating electric field, that is the interaction strength between the qubit levels, to selectively switch the qubit between an 'ON' state in which quantum information can be manipulated and an 'OFF' state in which quantum information, resulting from being manipulated, is stored in basis that is protected from decoherence.

And wherein the first pair of gates are also used to readout results of quantum computations as charge signals that represent spin states.

The spin states may be sensed by a nearby single electron transistor or a quantum point contacted.

A source of external magnetic field may be applied to the acceptor atom to lift a four-fold degeneracy of a ground state of the acceptor atom to facilitate flips of the hole spin at resonance using the alternating electric field.

The lowest two Zeeman levels may be used as the working levels when the qubit is in the 'ON' state.

Coherent qubit rotations may be driven by applying the alternating electric field to the gates in resonance with the two lowest Zeeman levels.

The direct electric field may be applied perpendicular to the interface, to switch the qubit 'OFF' state by bringing the hole bound to the acceptor atom closer to the interface.

A transfer of quantum information from the 'ON' state to the 'OFF' state may involve mixing working levels. This may involve simultaneously changing the direct electric field. This operation is required to be completed faster than the decoherence time of the acceptor bound hole-spin.

A method for operating a quantum computer comprising one or more electrically active acceptor atoms within a crystalline silicon, comprising the steps of:

applying an alternating electric field to the crystalline silicon to coherently drive rotations of a qubit at resonance;

applying a direct electric field to the crystalline silicon to control the interaction strength and to selectively switch the qubit between an 'ON' state in which quantum information can be manipulated, and an 'OFF' state in which quantum information, resulting from being manipulated, is stored in basis that is protected from decoherence; and reading out results of quantum computations as charge signals that represent spin states.

Systems with strong spin-orbit coupling allow for rapid all-electrical manipulation of spin states and therefore have significant potential for solid-state quantum computation [1-4]. Yet precisely the fact that spin states couple to electric fields leads to susceptibility to charge noise and phonon coupling. Protection from these decoherence sources can be found in the form of a pair of time-reversal symmetric states, or "Kramer doublets" within which electric dipole transitions are forbidden [5,6].

Crucial to the utilisation of acceptors in quantum computation is the controllable isolation of two working levels within the lowest energy Kramers doublet. We identify interface-split Kramers doublets of individual boron acceptors near a silicon surface. The observed energy splitting up to 4 meV effectively isolates a pair of time-reversal symmetric states, paving the way for rapid electrical qubit operations in acceptors without scattering into higher states [5].

BRIEF DESCRIPTION OF THE DRAWINGS

To assist in understanding the invention and to enable a person skilled in the art to put the invention into practical effect, embodiments of the invention are described below by way of example only with reference to the accompanying drawings, in which:

FIG. 1A illustrates two qubits, each of which is comprised of a single Boron dopant atom and a hole in a Silicon (Si) host, separated by a barrier from the metal gate pairs on the surface;

FIG. 1B illustrates the valence bands and acceptor states in Si;

FIG. 1C illustrates the Zeeman levels of the acceptor ground state;

FIG. 1D illustrates the Zeeman levels as a function of interface splitting $8E$;

FIG. 1E illustrates two adjacent gates pairs, as shown in FIG. 1A with both gate pairs are in the "OFF" state and an exchange gate between them, and the exchange gate is "ON";

FIG. 1F illustrates two adjacent gates pairs, as shown in FIG. 1A with both gate pairs are in the "OFF" state and an exchange gate between them, and the exchange gate is "OFF";

FIG. 1G illustrates two adjacent gates pairs, as shown in FIG. 1A with both gate pairs are in the "ON" state and an exchange gate between them. The exchange gate is "ON" to allow electric dipole coupling between the two gate pairs;

FIG. 2A illustrates contours of the normalised effective mass wavefunctions $|\psi_{\pm 3/2}|^2$ and $|\psi_{\pm 1/2}|^2 = 10^{-5}$ [dashed lines] calculated for an acceptor at 2 nm from the interface;

FIG. 2B illustrates contours of the normalised effective mass wavefunctions $|\psi_{\pm 3/2}|^2$ and $|\psi_{\pm 1/2}|^2 = 10^{-5}$ [dashed lines] calculated for an acceptor at 5 nm from the interface;

FIG. 2C illustrates contours of the normalised effective mass wavefunctions $|\psi_{\pm 3/2}|^2$ and $|\psi_{\pm 1/2}|^2=10^{-5}$ [dashed lines] calculated for an acceptor at 5 nm from the interface;

FIG. 3A illustrates a 3D differential conductance map measured above a sub-surface boron acceptor;

FIG. 3B is a schematic energy diagram of the tunnelling process. Applying a positive sample bias, eV results in upward tip-induced band bending [TIBB]. When the energy of a state of an isolated acceptor near the interface is pulled above the Fermi level $E_F$ there is a peak in the conductance due to resonant tunnelling from the valence impurity band through the acceptor state into the tip;

FIG. 3C illustrates differential conductance measured directly above the isolated acceptor [open circles]. The differential conductance in the band gap is fitted to the sum [solid line] of two peaks corresponding to resonant tunnelling through the localized acceptor states [dotted lines] and a third peak [dashed line] originating from direct tunnelling into the conduction band;

FIG. 3D illustrates measured spatially resolved probability density of the ±3/2 and ±1/2 Kramers doublets from the integrated differential conductance peaks as shown in FIG. 3C;

FIG. 3E illustrates energy splitting δE between the ±3/2 and ±1/2 Kramers doublets measured as a function of acceptor depth [diamonds], calculated using fully atomistic tight-binding simulations [circles];

FIG. 5A illustrates the calculated gate induced potential distribution map and electric field [arrows] for a silicon layer thickness $t_{Si}=20$ nm, barrier oxide thickness $t_{ax}=6$ nm and a gate spacing w=10 nm;

FIG. 5B illustrates the calculated electric field strength $E_{x,a.c.}$ as a function of the acceptor depth. The inset shows the Rabi frequency $f_{Rabi}$ as a function of the amplitude of the a.c. signal $V_{a.c.}$ applied to the gate pair for an acceptor 5 nm below the oxide layer [indicated by a circle in FIG. 5A and a dashed line in FIG. 5B];

FIG. 6 is a table of the key requirements of the acceptor qubit;

BEST MODES OF THE INVENTION

A full interface acceptor base quantum computer architecture will now be presented, combined with an evaluation of the performance.

Systems with strong spin-orbit coupling have significant potential for solid-state quantum computation [1, 2]. Strong spin-orbit interaction in the valence band of Si opens the possibility for rapid single-spin manipulation by dynamical electric fields within an acceptor-bound Kramers doublet [spin pair], while maintaining protection from decoherence by time-reversal symmetry [3, 4]. Crucial to the utilisation of acceptors in quantum computation is the controllable isolation of two working levels within the lowest energy Kramers doublet. We identify interface-split Kramers doublets of individual boron acceptors near a silicon surface. The observed energy splitting up to 4 meV effectively isolates a pair of time-reversal symmetric states, paving the way for rapid electrical qubit operations in acceptors without scattering into higher states [5].

Interface-Split Kramers Doublets for Acceptor-Based Qubits

Hole spins in semiconductors are a promising candidate for solid-state quantum bits [2, 4, 22 7, 8]. Unlike their electron counterparts, which are generally manipulated using an oscillating global magnetic field [9], single hole spin states in silicon can be controlled using a local oscillating electric field by means of electron dipolar spin resonance (EDSR) techniques [4, 7, 8] due to spin-orbit (SO) coupling in the valence band [5, 6]. Implementation of local EDSR spin manipulation has recently been demonstrated for electrons in III-V quantum dots [1] and nanowire qubits [3] and theoretically described for magnetic impurity atoms [10]. Single dopant atoms in silicon form a favourable confining potential for spin-based qubits in scalable quantum computers [9, 11]. Dopants are naturally occurring single electron systems, are therefore leading candidates for producing identical qubits. Electron spin relaxation times of a single P in Si in excess of 1 s have been demonstrated in devices [12] and recent in atomically precise dopant engineering have paved the way towards controllable atom devices [13]. Following the seminal proposal by Kane [11] based on $^{31}$P donors in silicon we propose an acceptor-based qubit architecture where the qubit-state can be rotated using an oscillating electric field and subsequently stored in a protected Kramers doublet state.

Figure 1:
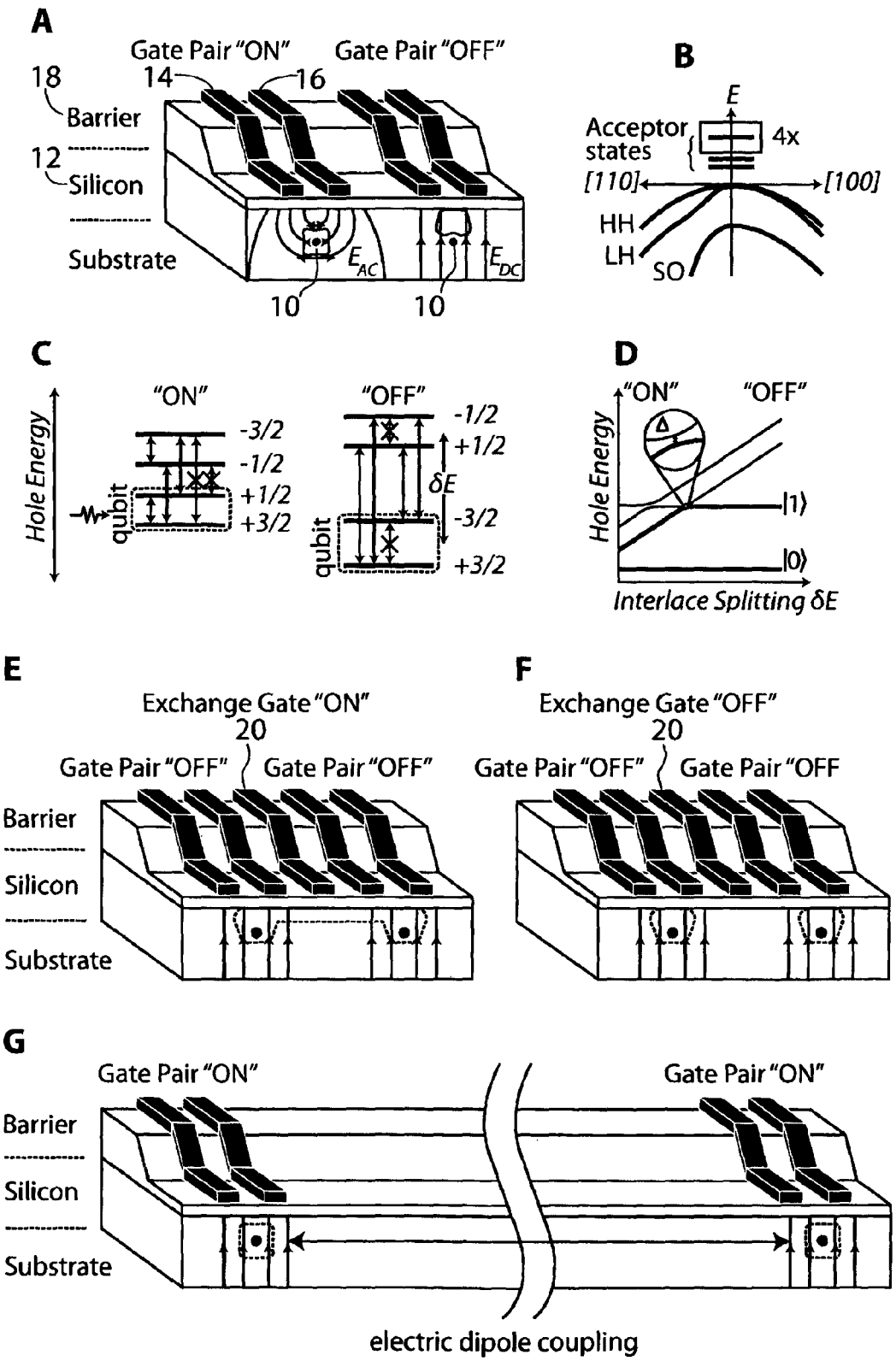
FIG. 1 illustrates the device geometry and energy levels of the acceptor qubit.

Referring now to FIG. 1, the qubit architecture comprises a single hole bound to an acceptor 10 positioned beneath the surface of a silicon host 12, see FIG. 1A. An alternating electric field applied to the gate pair 14, 16 flips the hole spin on resonance. A direct electric field shifts the hole away from the acceptor nucleus, tuning the interface splitting δE.

A single qubit operation is performed by precise control of two external parameters:

(1) An alternative current (a.c.) electric field applied to a pair of gates 14, 16 above the acceptor flips the hole spin at resonance; and (2) A direct current (d.c.) electric field applied to the same pair of gates 14, 16 controls the interaction strength, effectively switching the qubit "ON"/"OFF". When the qubit is "ON" quantum information can be manipulated, when the qubit is "OFF" the quantum information is stored in basis that is protected from decoherence.

Finally, measurements of the hole spin state are performed by means of spin-to-charge conversion. Qubit to qubit coupling is mediated by the exchange interaction supplied by exchange gate 20, see FIGS. 1E and 1F. Alternatively, electric dipole coupling between two qubits in the "ON" state provides a means of long distance (~100 nm) qubit-qubit interaction [14]. Importantly, electric dipole coupling to adjacent qubits only affects qubits in the "ON" basis, see FIG. 1G, as electric dipole transitions are forbidden in the "OFF" basis.

A key requirement for a qubit is to isolate its two working levels from any degrees of freedom which may cause decoherence when the qubit is not being manipulated. Two major sources of decoherence are: The hyperfine interaction with the nuclear spins in the host material, SO mediated coupling to phonons and charge-noise. A significant advantage of hole spins is that they have a small hyperfine interaction with the spin of the lattice nuclei due to the atomic p-like nature of the valence band [6]. As a consequence, coupling to the nuclear spin bath is weak. Relaxation times of 0.6 ms have recently been reported for hole spins in germanium-silicon core-shell nanowire qubits [7]. Moreover, electron spin coherence times of a fraction of a second have been demonstrated in isotopically refined bulk samples with no nuclear spins [13]. We will show coupling to phonons and charge-noise can be strongly suppressed when the qubit is switched "OFF".

The low energy states of shallow acceptors in silicon reflect the atomic p-like nature of the valence band states. Under influence of an external magnetic field H the four-fold degeneracy of the acceptor ground state is lifted by a Zeeman type interaction $\mu_B[g'_1 \cdot J \cdot H + g'_2(J_x^3 H_x + c.p.)]$, where $\mu_B$ is the Bohr magneton and $g'_1 \approx 1$ and $g'_2 \square g'_1$ are the renormalised g-factors. Due to the coupling between spin and orbital angular momentum, the acceptor spin-states can be flipped not only by an oscillating magnetic field (ESR) but also by an oscillating electric field (EDSR). The allowed EDSR transitions are shown in FIG. 1C. The two working levels are chosen such that an electrically driven transition between the working levels is allowed when the qubit is "ON" and the working levels are protected against decoherence when the qubit is "OFF". We choose the lowest two Zeeman levels as the working levels of our qubit are "ON", $|0\rangle_{ON}=|+3/2\rangle$ and $|1\rangle_{ON}=|+1/2\rangle$, such that qubit rotations are driven by applying an a.c. electric field to the gate pair in resonance with the $|+3/2\rangle \leftrightarrow |+1/2\rangle$ transition.

Figure 2:
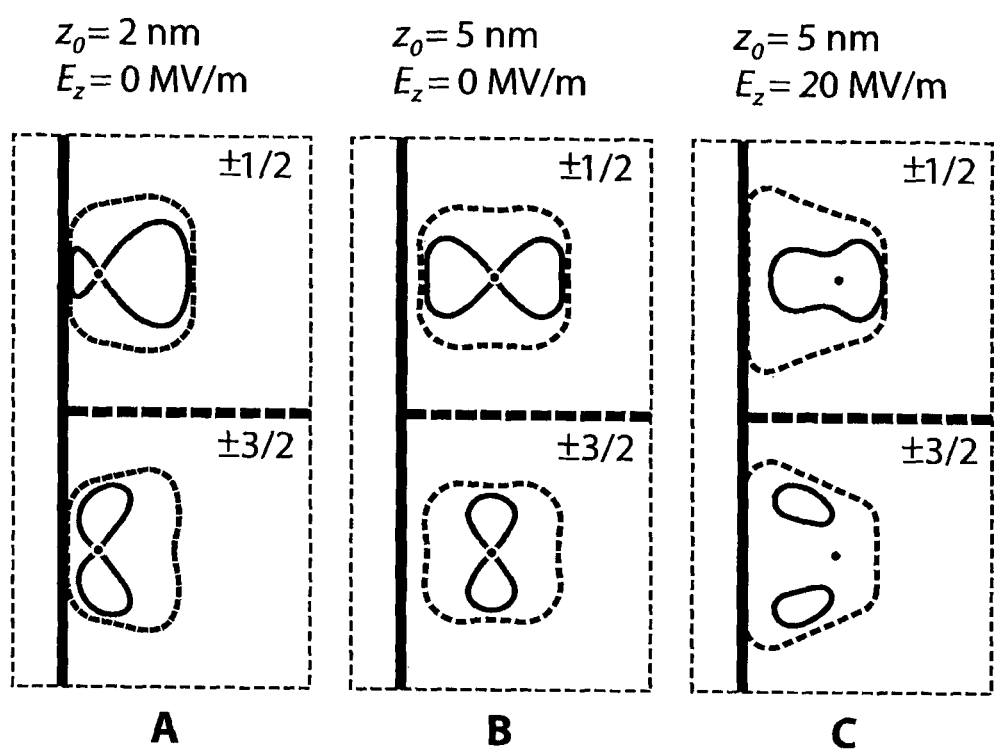
FIG. 2 illustrates the Interface-induce energy splitting of Kramers doublets. The energy splitting $\delta E$ between the $m_j=\pm 3/2$ and $m_j=1/2$ Kramers doublets arises from the dissimilitude of the d-like part of the envelope wavefunctions, which is illustrated by the calculated contour lines $|\psi_{\pm 3/2}|^2 - |\psi_{\pm 1/2}|^2$ and $|\psi_{\pm 1/2}|^2 - |\psi_{\pm 3/2}|^2 = 10^{-5}$ [solid lines]

Electron dipole transitions are forbidden between $|\pm 3/2\rangle$ states to first order, protecting them from decoherence by phonon coupling or charge-noise. This makes these states extremely suitable to store qubit information. We therefore choose the working levels to be $|0\leftrightarrow_{OFF}=|+3/2\rangle$ and $|1\leftrightarrow_{OFF}=|-3/2\leftrightarrow$ when the qubit is not being manipulated, i.e. when the qubit is in the "OFF" state. To switch the qubit to the "OFF" state the $|\pm 1/2\rangle$ Kramers doublet is shifted upwards in energy by applying a d.c. electric field perpendicular to the interface. Due to coupling between the effective hole spin J (the pseudo angular momentum of the Bloch functions) and the angular momentum of the envelope wavefunction L the ground-state wavefunctions of bulk acceptors are an admixture of hydrogenic s- and d-like envelope orbitals. The degeneracy of the d-like part of the envelope wavefunction is lifted by either bringing the acceptor closing to the interface, or by applying an electric field perpendicular to the interface. In particular, when the cubic symmetry of the host crystal is broken by either strain, a static electric field or by the presence of an interface the four-fold degeneracy of the d-like envelope orbitals is lifted, resulting in a finite energy splitting between the ±3/2 and ±1/2 Kramers doublets. In the case of an acceptor near an interface, exclusion of the hole wave function from the half-space z<0 perturbs the d-like orbitals parallel to the interface of the ±3/2 Kramers doublet less than the d-like orbitals perpendicular to the surface of the ±1/2 Kramers doublet, as illustrated in FIG. 2. Consequently the ±1/2 Kramers doublet states shift up in energy, with respect to the ±3/2 Kramers doublet states for acceptors closer to the interface. Importantly, the same mechanism splits the ±3/2 and ±1/2 states when the wavefunction is pulled towards the interface by a d.c. electric field.

To transfer quantum information from the "ON" basis to the "OFF" basis requires mixing of the $|\pm 1/2\rangle$ and the $|-3/2\rangle$ states and leads to an avoided crossing with an energy gap as shown in FIG. 1D. For a magnetic field $H_\perp$ perpendicular to an interface the Zeeman levels $|\pm 1/2\rangle$ will shift with an energy splitting $\delta E$ with respect to the Zeeman levels $|\pm 3/2\rangle$ due to the presence of the interface. As discussed, the magnitude of $\delta E$ can be controlled by shifting the hole wavefunction away from the acceptor nucleus towards the interface using the d.c. electric field applied to the gate pair. When the qubit is "OFF" the interface splitting $\delta E$ is larger than the Zeeman splitting between the working levels, such that the $|\pm 1/2\rangle$ and $|-3/2\rangle$ levels cross when switching the qubit "ON"/"OFF". A magnetic field $H_\square$ parallel to the interface mixes the $|\pm 1/2\rangle$ and $|-3/2\rangle$ states resulting in an avoided crossing with an energy gap $\Delta \square 1/2 \ \mu_B g_1 H_\perp [1-\sqrt{1+7(H_\square/H_\perp)^2}]|$. By sweeping the d.c. electric field slower than $\Delta/h$ through the avoided crossing the quantum information is transferred between the "ON" and the "OFF" basis of the qubit.

The operation of the proposed acceptor based quantum computer requires that the quantum information can be manipulated and transferred from the "ON" basis to the protected "OFF" basis faster than the decoherence time of the acceptor bound hole-spin. An overview of the requirements is shown in Table 1 of FIG. 6. A linear stark coupling of 0.25 D, as estimated for bulk born acceptors, yields a Rabi frequency $f_{Rabi} \square 1$ GHz. The crucial parameter however is the interface-induced splitting $\delta E$ which needs to be in the order of 1 THz [4 meV] in order to exceed the Zeeman splitting.

The allowed EDSR transitions in the "ON" and "OFF" basis that are schematically depicted in FIG. 1 offer good relaxation times. A slightly different configuration of the acceptor atom, i.e. 0.5 nm from the interface instead of 5 nm, will allow for an alternative "ON" and "OFF" state with a large difference in the electrical dipole moment and thus decoherence sensitivity. Calculations also show that in the case of a bulk acceptor the EDSR transitions $e|(\pm 1/2|\eta|\pm 3/2)|$ ($\eta$=x, y, z) observe the selection rules [20] and have an amplitude $p_{eff}$=0.47D (D=3.36×10$^{-30}$ Cm) which is close to $p_{eff}$=0.26D which was determined using electron paramagnetic resonance measurements [21]. These calculations show that transitions between $|\pm 1/2\rangle$ and $|\pm 3/2\rangle$ can be driven by applying an a.c. electric field at a Rabi frequency $f_{Rabi} \square 1$ GHz×$E_{a.c.}$ MV/m. Our calculations also show that in the case of a bulk acceptor electron dipole transitions are forbidden between $|\pm 3/2\rangle$ states ($p_{eff}$=1.1×10$^{-4}$D) to first order [20]. When we calculate the phonon induced energy relaxation time T1 we find that inter Kramers doublet relaxation time for a bulk acceptor $T_1$=0.5 µs at B=2 T and is proportional to B-3 indicating that this is a direct process. On the other hand, the intra Kramers doublet relaxation time $T_1$=4 s at B=2 T and is proportional to B$^{-5}$ indicating this is a second-order process. It can be concluded that for a bulk acceptor the working levels $|0\rangle_{OFF}=|+3/2\rangle$ and $|1\rangle_{OFF}=|-3/2\rangle$ when the qubit is not being manipulated, i.e. when the qubit is in the "OFF" state, are protected from decoherence by phonon coupling or charge-noise, whereas transitions between the working levels $|0\rangle_{OFF}=|+3/2\rangle$ and $|1\rangle_{ON}=|-3/2\rangle$ can be driven by an a.c. electric field.

We have calculated the interface-splitting using a fully atomistic tight-binding method and found that for acceptors less than the effective Bohr radius away from the interface $\delta E$>4 meV. Moreover, for acceptors $\square 5$ nm from the interface, $\delta E$ can be tuned from 0 to >6 meV. The predicted Kramers doublet states of near-interface acceptors have a much larger electric field splitting than bulk acceptors <0.5 meV for $E_z$=40 MV/m. Here, the nearby interface is not only responsible for the splitting, but also prevents rapid ionisation that would inevitably occur for bulk acceptor-bound holes experiencing electric fields exceeding: 5 MV/m fields.

In the remainder of the present disclosure we will experimentally verify the predicted interface-splitting for acceptors between 2 and 0.5 nm from the interface.

We use scanning tunnelling spectroscopy (STS) to investigate the feasibility of acceptor-based qubits by studying the interface induced energy-splitting of Kramers doublet states of sub-surface boron acceptors. Single-electron transport formalisms [14, 15] employed to STS data permit a quantitative measurement of the energy spectrum of individual boron acceptors less than an effective Bohr radius away from the silicon interface ($a^*_B$: 2 nm for B in Si). Previous studies have demonstrated the capability of STS to spatially map the probability density of the quantum states of sub-surface impurities [16-18]. Here we will demonstrate how, in addition to the probability densities, the energies of localized quantum states can be inferred from the thermal broadening of the corresponding differential conductance peaks using STS.

Figure 3:
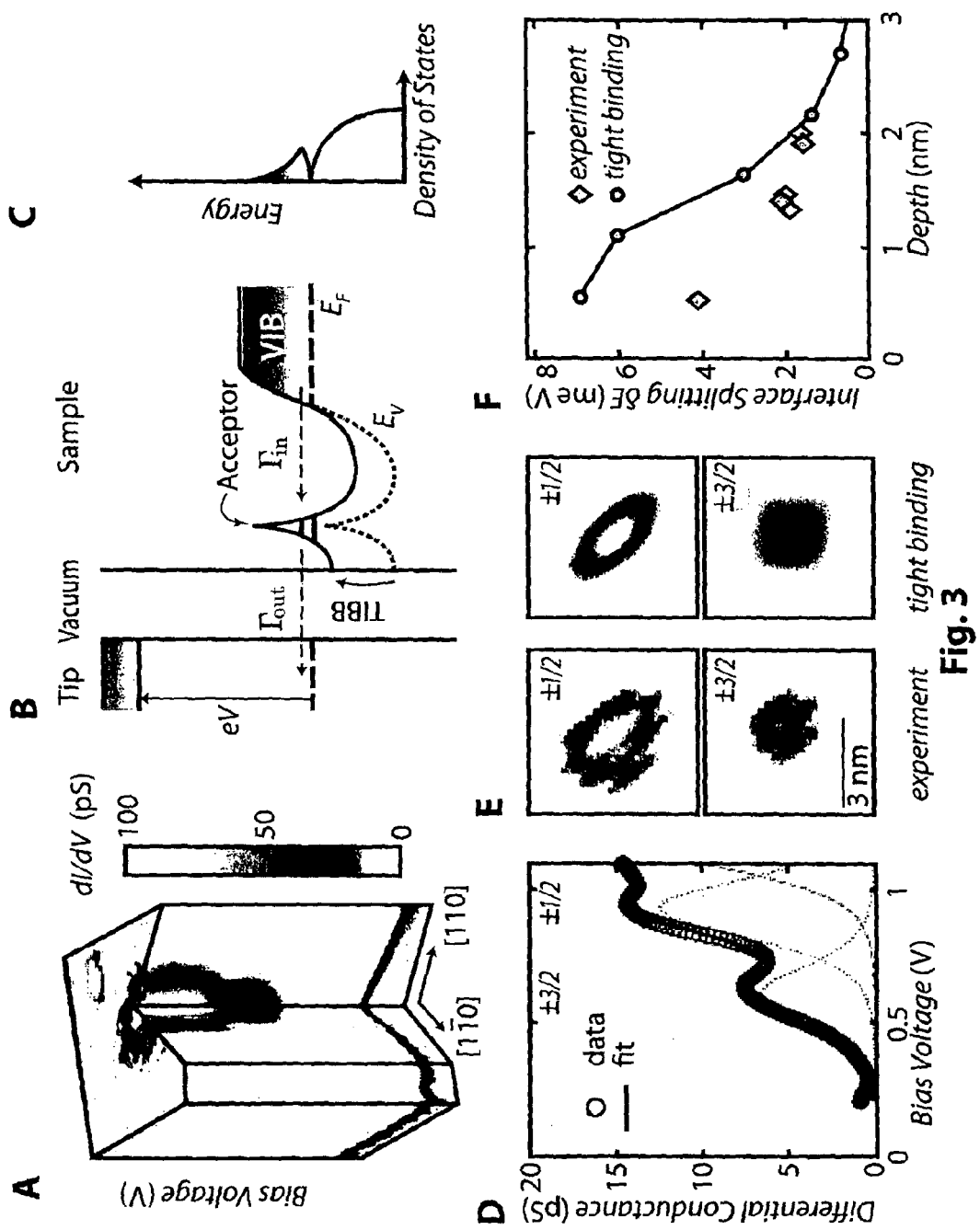
FIG. 3 illustrates Scanning tunnelling spectroscopy of a single boron dopant atom.

FIG. 3A shows the spatially resolved differential conductance spectrum measured above a single boron dopant beneath the hydrogen terminated B doped ($N_A$: $8\times10^{18}$ cm$^{-3}$) silicon [100] surface measured at T=4.2 K. Differential conductance spectra were obtained by measuring current-voltage (I-V) traces as function of tip position and subsequently taking the numerical derivative to obtain the differential conductance dI/dV. Above a sub-surface acceptor the resultant dI/dV map clearly shows two conductance peaks in the band gap due to resonant tunnelling occurring via the localized states of the isolated acceptor. FIG. 3B schematically depicts the resonant tunnelling process. The chemical potential of the localized states are shifted in energy by tip induced band bending (TIBB) such that a conductance peak occurs whenever an acceptor state enters the bias window. When a localized acceptor state resides in the bias window, holes tunnel into this state from the valence impurity band VIB, see FIG. 3C, which forms away from the surface due to heavy doping of the substrate [19], and tunnel out to the tip.

The splitting δE between the first and second conductance peak is determined by fitting the differential conductance peaks to a thermally broadened Lorentzian line shape, see FIG. 3D, where we use the sample electron temperature T=4.2 K as a reference. FIG. 3E compares the amplitude of the differential conductance peaks as function of lateral tip position with the probability density of the ±3/2 and ±1/2 Kramers doublets at the interface calculated using a fully atomistic tight-binding simulation. Experiment and calculations are in excellent agreement, from which we can infer that the first and second differential conductance peak correspond to resonant tunnelling through the ±3/2 and ±1/2 Kramers doublets respectively. In addition, the observed probability density corresponding to the first and second conductance peak are predominantly s-like, i.e. there are no nodes in the wavefunction. In particular, the similarity of the orbital part of the wavefunctions means that their overall orthogonality is preserved by their spin quantum numbers, as expected for Kramers doublets of predominantly ±3/2 and ±1/2 character.

Now that we have firmly established the two differential conductance peaks measured above a sub-surface acceptor correspond to the ±3/2 and ±1/2 Kramers doublets, we can study the depth dependence of the interface induced splitting δE. The depth of individual acceptors is determined by a two-dimensional (2D) fit of the spectral shift of the top valence band at the interface 20. The spatial variation of top of the valence band is inferred from the slope of the normalized conductance as a function of lateral tip position. Fitting the spatially resolved valence band edge to a Coulomb potential centred at a depth $z_0$ yields both the vertical and lateral position of the sub-surface acceptor nucleus. Six different acceptors were studied and the measured ground-state splitting $\delta E=\alpha(V_1-V_0)$ is shown as a function of dopant depth $z_0$ by filled diamonds in FIG. 3E. There is a clear trend of increasing splitting between the Kramer's doublets as acceptors approach the interface, in agreement with the trend predicted from tight-binding simulations. The measured values for δE are a factor of □ 1.5 smaller than this predicted by tight binding however the observed splitting still meets the requirements for our proposed acceptor-based quantum computer.

Switching the Qubit "ON/OFF"

The qubit can be switched between the "ON" state, where transitions between the qubit working levels are allowed, and the "OFF" state, where transition between the qubit working levels are forbidden, by applying a d.c. electric field $E_{z,d.c.}$ perpendicular to the interface. The key requirement here is that in the absence of an electric field the wavefunction is localized on the acceptor ion and the field induced splitting δE is small such that the Zeeman splitting between |+3/2⟩ and |+1/2⟩, $E_z$>δE i.e. the qubit is in the "ON" state. When the electric field is applied, the wavefunction is pulled towards the interface, which should lead to an increase of the interface induced splitting δE>$E_Z$ switching the qubit to the "OFF" state, i.e. transition between the qubit working levels are forbidden.

The d.c. electric field induced perpendicular to the interface [z-direction] induced by the gate electrodes in the device geometry depicted in FIG. 1 is given by:

$$E_{z,d.c.} = \frac{V_{d.c.}}{t_{Si} + \frac{\varepsilon_{Si}}{\varepsilon_{ox}}t_{ox}},$$

where $V_{d.c.}$ is the d.c. gate voltage and $\varepsilon_{Si}$=11.9, $\varepsilon_{ox}$=3.9 are the dielectric constant of Si and SiO2 respectively. For a barrier oxide thickness of $t_{ox}$=6 nm and a silicon layer thickness of $t_{Si}$=20 nm this yields a d.c. electric field $E_{z,d.c.}$:40 (MV/m)×$V_{d.c.}$ (V).

Figure 4:
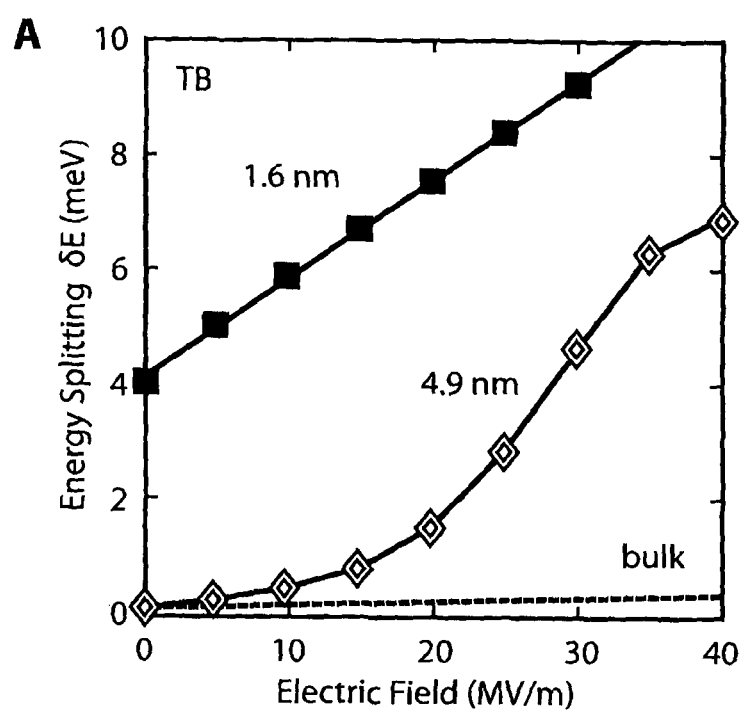
FIG. 4 illustrates interface-splitting by a d.c. electric field. The electric field is applied perpendicular to the interface. For an acceptor near the interface [filled squares] the ground-state energy splitting induced by the interface at zero electric field increases as a function of electric field. For acceptors 4.9 nm away from the interface [filled diamonds] there is no appreciable splitting between the Kramers doublets in the absence of an external electric field. Upon applying an electric field there is a strong increase in the ground-state energy splitting. The predicted electric field induced energy splitting for acceptors close to the interface [solid lines] is much larger than the predicted energy splitting for bulk acceptors, [dashed line]

FIG. 4 shows the energy splitting of the ground-state as a function of field for dopants at various depths calculated using tight binding. The presence of the interface causes the four-fold degeneracy of the ground-state to be lifted for acceptor near the interface [$z_0$=1.6 nm indicated by filled squares in FIG. 4]. By applying an external electric field perpendicular to the interface, the energy splitting of the ground state is further increased. In contrast, for acceptors further from the interface [$z_0$=4.9 nm indicated by filled diamonds] the energy splitting approaches zero in the absence of an external electric field. Upon applying an external electric field, the degeneracy of the d-like orbitals is lifted, leading to the formation of two Kramers doublets. There is an increase in the ground-state energy splitting caused by the acceptor wavefunction being pulled towards the interface such that the d-like orbital perpendicular to the surface; corresponding to the $m_J$=±1/2 Kramers doublet, is more strongly perturbed than those parallel to the interface with $m_J = \pm 3/2$. The predicted splitting $\delta E$ of near-interface acceptors (shown as solid lines in FIG. 4), have a much larger electric field splitting than bulk acceptors (shown as dashed line in FIG. 4). The nearby interface is not only responsible for the splitting, but also prevents rapid ionisation that would inevitably occur for bulk acceptor-bound holes experiencing electric fields exceeding: 5 MV/m fields.

Driving Rabi Oscillations

Figure 5:
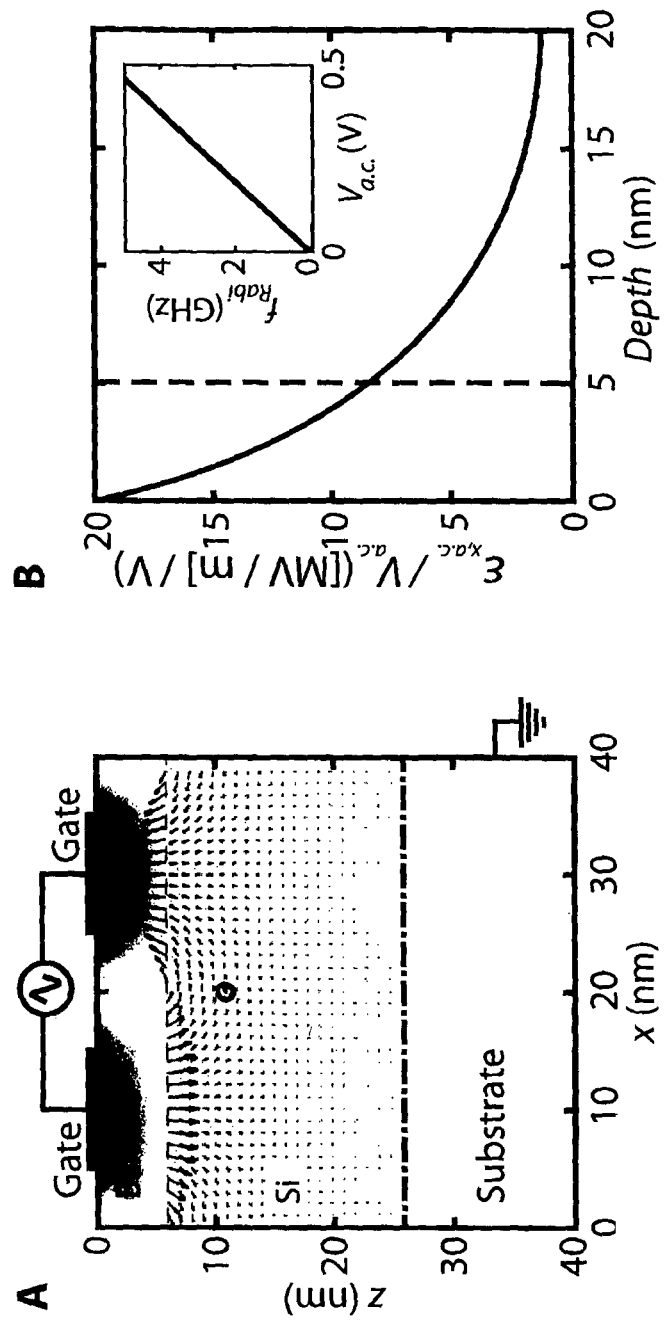
FIG. 5 illustrates Rabi oscillations driven by an a.c. electric field.
Figure 7:
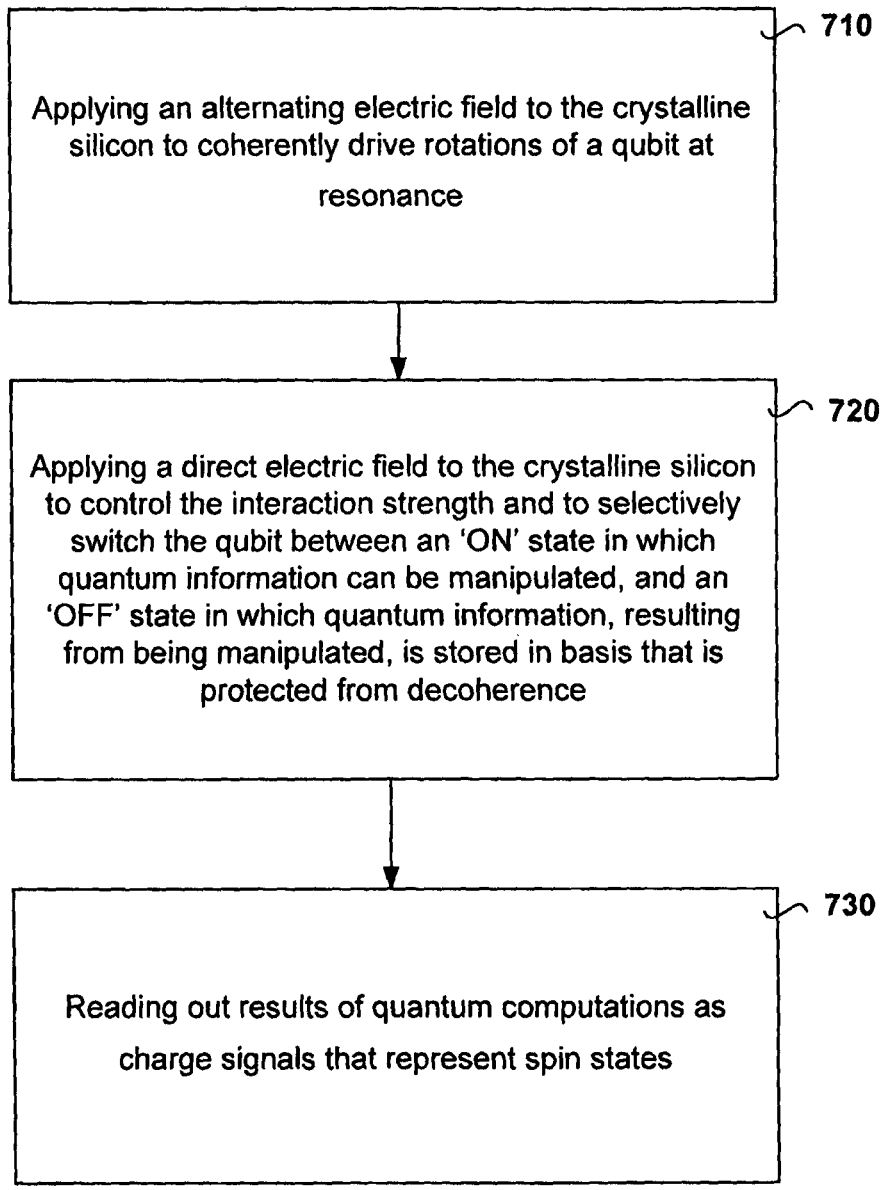
FIG. 7 illustrates a flow chart for operating a quantum computer.

When the qubit is in the "ON" state, i.e. when the hole wavefunction is localised on the acceptor nucleus, Rabi oscillations between the two lowest acceptor levels $|+3/2\rangle$ and $|\pm 1/2\rangle$—that constitute the working levels of the qubit in the "ON" state—can be driven by applying an a.c. signal to the gate pair above the acceptor on resonance. The resonance frequency $\omega = E_Z/\hbar$ is determined by the Zeeman splitting between the $|+3/2\rangle$ and $|\pm 1/2\rangle$ levels, see FIGS. 5A and 5B.

FIG. 6 is a flow diagram illustrating an example method of operating a quantum computer. The method involves applying a.c. electric field 610 to a pair of gates 14, 16 on the crystalline silicon to coherently drive qubit rotations at resonance and applying a d.c. electric field to switch the qubit between an 'ON' state and an 'OFF' state 620, where quantum information can be manipulated during the 'ON' state and stored with protection from decoherence during 'OFF state'. The results can be read out as charge signals 630.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. Accordingly, this patent specification is intended to embrace all alternatives, modifications and variations of the present invention that have been discussed herein, and other embodiments that fall within the spirit and scope of the above described invention.

REFERENCES

1. K. C. Nowack, F. H. L. Koppens, Y. V. Nazarov, L. M. K. Vandersypen, Science 318, 1430 [2007].
2. S. Nadj-Perge, S. M. Frolov, E. P. A. M. Backers, L. P. Kouwenhoven, Nature 468, 1084 [2010].
3. Y. Song, B. Golding, EPL [Europhysics Letters] 95, 47004 [2011].
4. C. Kloeffel, M. Trif, D. Loss, Physical Review B 84, 195314 [2011].
5. S. Goswami, et al., Nature Physics 3, 41 [2006].
6. D. Brunner, et al., Science 325, 70 [2009].
7. Y. Hu, F. Kuemmeth, C. M. Lieber, C. M. Marcus, Nature Nanotechnology 7, 47 [2011].
8. J. J. L. Morton, D. R. McCamey, M. A. Eriksson, S. A. Lyon, Nature 479, 345 [2011].
9. J.-M. Tang, J. Levy, M. Flatte', Physical Review Letters 97 [2006].
10. B. E. Kane, Nature 393, 133 [1998].
11. A. Morello, et al., Nature 467, 687 [2010].
12. M. Fuechsle, et al., Nature Nanotechnology 7, 242 [2012].
13. A. M. Tyryshkin, et al., Nature Materials 11, 143 [2011].
14. D. Averin, A. Korotkov, K. Likharev, Physical Review B 44, 6199 [1991].
15. C. Beenakker, Physical Review B 44, 1646 [1991].
16. A. Yakunin, et al., Physical Review Letters 92 [2004].
17. A. M. Yakunin, et al., Nature Materials 6, 512 [2007].
18. S. Loth, M. Wenderoth, R. Ulbrich, S. Malzer, G. Dohler, Physical Review B 76, 235318 [2007].
19. A. P. Wijnheijmer, J. K. Garleff, M. A. von d Heijden, P. M. Koenraad, Journal Of Vacuum Science & Technology B 28, 1086 [2010].
20. G. L. Bir, E. I. Butikov, G. E. Pikus, Journal of Physics and Chemistry of Solids 24, 1475 [1963].
21. A. Kopf, K. Lassmann, Physical Review Letters 69, 1580 (1992).
22. D. Schechter, Journal of Physics and Chemistry of Solids 23, 237 [1962].
23. N. Lipari, A. Baldereschi, Physical Review Letters 25, 1660 [1970].

The invention claimed is:

1. A quantum computer, comprising:
one or more electrically active acceptor atoms incorporated into a crystalline silicon, wherein each acceptor atom creates a single hole bound to the acceptor atom within the crystalline silicon to form an acceptor qubit, wherein each acceptor qubit is either in an 'ON' state where the acceptor qubit is able to be manipulated by applying an alternating electric field, or in an 'OFF' state where the qubit is protected from decoherence;
a first pair of gates located above each acceptor atom, by which the alternating electric field applied to the crystalline silicon manipulates a spin of the hole of the acceptor atom at resonance, and by which a direct electric field is applied to the crystalline silicon to control an interaction strength between one or more qubit levels, to selectively switch the acceptor qubit between an 'ON' state in which quantum information can be manipulated and an 'OFF' state in which quantum information, resulting from being manipulated, is stored in basis that is protected from decoherence,
and wherein the first pair of gates are also used to readout results of quantum computations as charge signals that represent one or more spin states.

2. The quantum computer as claimed in claim 1, wherein the spin states are sensed by a nearby single electron transistor or a quantum point contacted.

3. The quantum computer as claimed in claim 1 wherein a source of external magnetic field is applied to the acceptor atom to lift a four-fold degeneracy of a ground state of the acceptor atom to facilitate flips of the spin of the hole at resonance using the alternating electric field.

4. The quantum computer as claimed in claim 1, wherein two lowest Zeeman levels may be used as working levels when the acceptor qubit is in the 'ON' state.

5. The quantum computer as claimed in claim 4, wherein coherent qubit rotations are driven by applying the alternating electric field to the gates in resonance with the two lowest Zeeman levels.

6. The quantum computer as claimed in claim 1, wherein the direct electric field is applied perpendicular to an interface to switch the qubit to the 'OFF' state by bringing the hole bound to the acceptor atom closer to the interface.

7. The quantum computer as claimed in claim 1, wherein a transfer of quantum information from the 'ON' state to the 'OFF' state involves mixing working levels.

8. The quantum computer as claimed in claim 7, wherein the transfer of quantum information involves simultaneously changing both a magnetic field parallel to the interface and the direct electric field.

9. The quantum computer as claimed in claim 8, wherein the transfer of quantum information is required to be completed faster than the spin decoherence time.

10. A method for operating a quantum computer, comprising the steps of:

applying an alternating electric field to one or more electrically active acceptor atoms incorporated into a crystalline silicon to manipulate, at resonance, a spin of a single hole created by each of the acceptor atoms and bound to the acceptor atom within the crystalline silicon to form an acceptor qubit;

applying a direct electric field to the crystalline silicon to control an interaction strength between one or more qubit levels and to selectively switch the acceptor qubit between an 'ON' state in which quantum information can be manipulated by applying the alternating electric field, and an 'OFF' state in which quantum information, resulting from being manipulated, is stored in basis that is protected from decoherence; and reading out results of quantum computations as charge signals that represent one or more spin states.

* * * * *

UNITED STATES PATENT AND TRADEMARK OFFICE
CERTIFICATE OF CORRECTION

PATENT NO. : 9,691,033 B2
APPLICATION NO. : 14/778361
DATED : June 27, 2017
INVENTOR(S) : Rogge et al.

It is certified that error appears in the above-identified patent and that said Letters Patent is hereby corrected as shown below:

In the Specification

Column 2, Line 43 should read    interface splitting $\delta E$;

Column 5, Line 21 should read    $\mu_B$ is the Bohr magneton and $g_1' \approx 1$ and $g_2' \ll g_1'$ are the Column 5, Lines 39-40 should read   choose the working levels to be
$|0\rangle_{OFF} = |+3/2\rangle$ and $|1\rangle_{OFF} = |-3/2\rangle$
when the qubit is not being manipulated, Column 6, Lines 14-19 should read   the qubit "ON"/"OFF". A magnetic field
$H_\parallel$ parallel to the interface mixes the
$|+1/2\rangle$ and $|-3/2\rangle$ states resulting in an
avoided crossing with an energy gap
$$\Delta \sim \left| \frac{1}{2} \mu_B g_1' H_\perp \left[ 1 - \sqrt{1 + 7(H_\parallel / H_\perp)^2} \right] \right|.$$
By sweeping the d.c. electric field slower
than $\Delta/\hbar$ through the avoided crossing
the quantum information Column 6, Line 29 should read    frequency $f_{Rabi} \sim 1$ GHz. The crucial parameter however is Column 6, Line 47 should read    $f_{Rabi} \sim 1$ GHz $\times \mathcal{E}_{a.c.}$ MV/m. Our calculations also show that Column 6, Line 66 should read    $\delta E > 4 meV$. Moreover, for acceptors Signed and Sealed this
Sixth Day of February, 2018

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,691,033 B2

|  |  |
|---|---|
| | ~ 5 nm from the interface, |
| Column 7, Lines 3-6 should read | meV for $\mathcal{E}_z = 40$ MV/m. Here, the nearby interface is not only responsible for the splitting, but also prevents rapid ionisation that would inevitably occur for bulk acceptor-bound holes experiencing electric fields exceeding ~ 5 MV/m fields. |
| Column 7, Line 17 should read | the silicon interface ($a_B^* \sim 2$ nm for B in Si). Previous studies |
| Column 8, Line 17 should read | measured values for $\delta E$ are a factor of ~ 1.5 smaller than |
| Column 8, Line 49 should read | $\mathcal{E}_{z,d.c.} \sim 40$ (MV/m)$\times V_{d.c.}$ (V). |
| Column 9, Line 7 should read | holes experiencing electric fields exceeding ~ 5 MV/m fields. |